(12) United States Patent
Zhang

(10) Patent No.: US 11,651,130 B2
(45) Date of Patent: May 16, 2023

(54) METHOD, DEVICE, AND STORAGE MEDIUM FOR SIMULATING A DESIGN

(71) Applicant: XEPIC CORPORATION LIMITED, Nanjing (CN)

(72) Inventor: Jinya Zhang, Shanghai (CN)

(73) Assignee: XEPIC CORPORATION LIMITED, Nanjing (CN)

( * ) Notice: Subject to any disclaimer, the term of this patent is extended or adjusted under 35 U.S.C. 154(b) by 41 days.

(21) Appl. No.: 17/548,110

(22) Filed: Dec. 10, 2021

(65) Prior Publication Data
US 2022/0198112 A1    Jun. 23, 2022

(30) Foreign Application Priority Data
Dec. 17, 2020   (CN) .......................... 202011490081.X

(51) Int. Cl.
| | |
|---|---|
| *G06F 30/30* | (2020.01) |
| *G06F 30/3308* | (2020.01) |
| *G06F 30/323* | (2020.01) |

(52) U.S. Cl.
CPC ........ *G06F 30/3308* (2020.01); *G06F 30/323* (2020.01)

(58) Field of Classification Search
None
See application file for complete search history.

(56) References Cited

U.S. PATENT DOCUMENTS

| | | | | | |
|---|---|---|---|---|---|
| 5,999,732 | A | * | 12/1999 | Bak ...................... | G06F 9/45516 717/148 |
| 7,398,531 | B2 | * | 7/2008 | Lari ...................... | G06F 9/4488 711/E12.006 |

(Continued)

FOREIGN PATENT DOCUMENTS

| | | |
|---|---|---|
| CN | 1234553 A | 11/1999 |
| CN | 1653418 A | 8/2005 |

(Continued)

OTHER PUBLICATIONS

Wen Wu, "C# Generic Programming", Kaiyuan Blog, https://my.oschina.net/Obahua/blog/93970, p. 1-11, Dec. 5, 2012.

(Continued)

*Primary Examiner* — Leigh M Garbowski
(74) *Attorney, Agent, or Firm* — Anova Law Group, PLLC

(57) ABSTRACT

The present disclosure provides methods and devices for simulating a design, wherein the design comprises a main class with parameters and a plurality of instances of the main class, wherein the plurality of instances comprise a first instance and a second instance. The method includes: determining, by analyzing the design, a plurality of secondary classes associated with instantiating the main class, wherein the plurality of secondary classes are used as the parameters of the main class and comprise a first secondary class corresponding to the first instance and a second secondary class corresponding to the second instance; translating the design to generate a first temporary code associated with the plurality of instances; generating, based on the first temporary code, a plurality of instance machine codes corresponding to the plurality of instances; and simulating the design based on the plurality of instance machine codes.

17 Claims, 11 Drawing Sheets

(56) References Cited

U.S. PATENT DOCUMENTS

| | | | | |
|---|---|---|---|---|
| 8,819,650 B2* | 8/2014 | Barcia | ............... | G06F 9/445 |
| | | | | 717/147 |
| 10,241,761 B2* | 3/2019 | Marathe | ............... | G06F 8/41 |
| 10,540,148 B2* | 1/2020 | Rose | ............... | G06F 8/31 |

FOREIGN PATENT DOCUMENTS

| | | | |
|---|---|---|---|
| CN | 101169718 | A | 4/2008 |
| CN | 102419724 | A | 4/2012 |
| CN | 105740036 | A | 7/2016 |
| CN | 110245468 | A | 9/2019 |
| CN | 111966424 | A | 11/2020 |

OTHER PUBLICATIONS

Blackheart, "[C#2] 1-Generic", Tencent Cloud, https://cloud.tencent.com/developer/article/1025182, p. 1-4, Jan. 19, 2018.

* cited by examiner

US 11,651,130 B2

METHOD, DEVICE, AND STORAGE MEDIUM FOR SIMULATING A DESIGN

CROSS REFERENCE TO RELATED APPLICATION

This application claims priority to Chinese Patent Application No. 202011490081.X, filed Dec. 17, 2020, which is incorporated herein by reference in its entirety.

TECHNICAL FIELD

This disclosure is related to an area of computer software, and more particularly to methods, devices, and storage medium for simulating a design.

BACKGROUND

In the area of integrated circuit verification, simulation generally refers to running a design on a computer after compiling the design, so as to simulate and test a variety of functions of the design. The design can be, for example, an application specific integrated circuit (ASIC), a System-on-Chip (SOC) design, and the like. Therefore, the design being tested or verified during the simulation can also be referred to as a Device Under Test (DUT).

While a design is being compiled, it will take a long time to compile a class in the design if a plurality of parameters contained in the class are classes other than the above-mentioned class.

SUMMARY

In view of the above problems, the disclosure provides methods, electronic devices, and storage medium for simulating a design.

A first aspect of the disclosure provides a method for simulating a design, wherein the design comprises a main class with parameters and a plurality of instances of the main class, wherein the plurality of instances comprise a first instance and a second instance, the method comprising: determining, by analyzing the design, a plurality of secondary classes associated with instantiating the main class, wherein the plurality of secondary classes are used as the parameters of the main class and comprise a first secondary class corresponding to the first instance and a second secondary class corresponding to the second instance; translating the design to generate a first temporary code associated with the plurality of instances; generating, based on the first temporary code, a plurality of instance machine codes corresponding to the plurality of instances; and simulating the design based on the plurality of instance machine codes.

A second aspect of the disclosure provides an electronic device, comprising: a memory for storing a set of instructions; and at least one processor configured to execute the set of instructions to perform the method described in the first aspect.

A third aspect of the disclosure provides a non-transitory computer-readable storage medium that stores a set of instructions that is executable by at least one processor of a computer system to cause the computer system to perform the method described in the first aspect.

The disclosure provides methods, electronic devices, and storage medium for simulating a design, improving the compilation speed by optimizing the processing manner of temporary codes, which further improves the efficiency of the simulation.

BRIEF DESCRIPTION OF THE DRAWINGS

To describe the technical solutions in the present disclosure more clearly, the following will briefly introduce the figures that need to be used in the embodiments or the prior art. Obviously, the figures in the following description are merely exemplary. For those ordinary skilled in the art, without creative work, other figures can be obtained based on these figures.

DETAILED DESCRIPTION

To make the objectives, technical solutions, and advantages of the disclosure clearer, the following description of the disclosure will be made in association with embodiments and drawings.

It should be noted that, unless otherwise defined, the technical terms or scientific terms used in the disclosure shall have the usual meanings understood by those ordinary skilled in the art to which this disclosure belongs. Phrases such as "first" or "second" used in the disclosure do not indicate any order, quantity, or importance, but are only used to distinguish different components. Phrases such as "include" or "comprise" mean that the element or item appearing before the word covers the element or item listed after the word and its equivalents, but does not exclude other elements or items. Prases such as "connection" or "connected" are not limited to physical or mechanical connections, but may include electrical connections, whether direct or indirect.

Figure 1A:
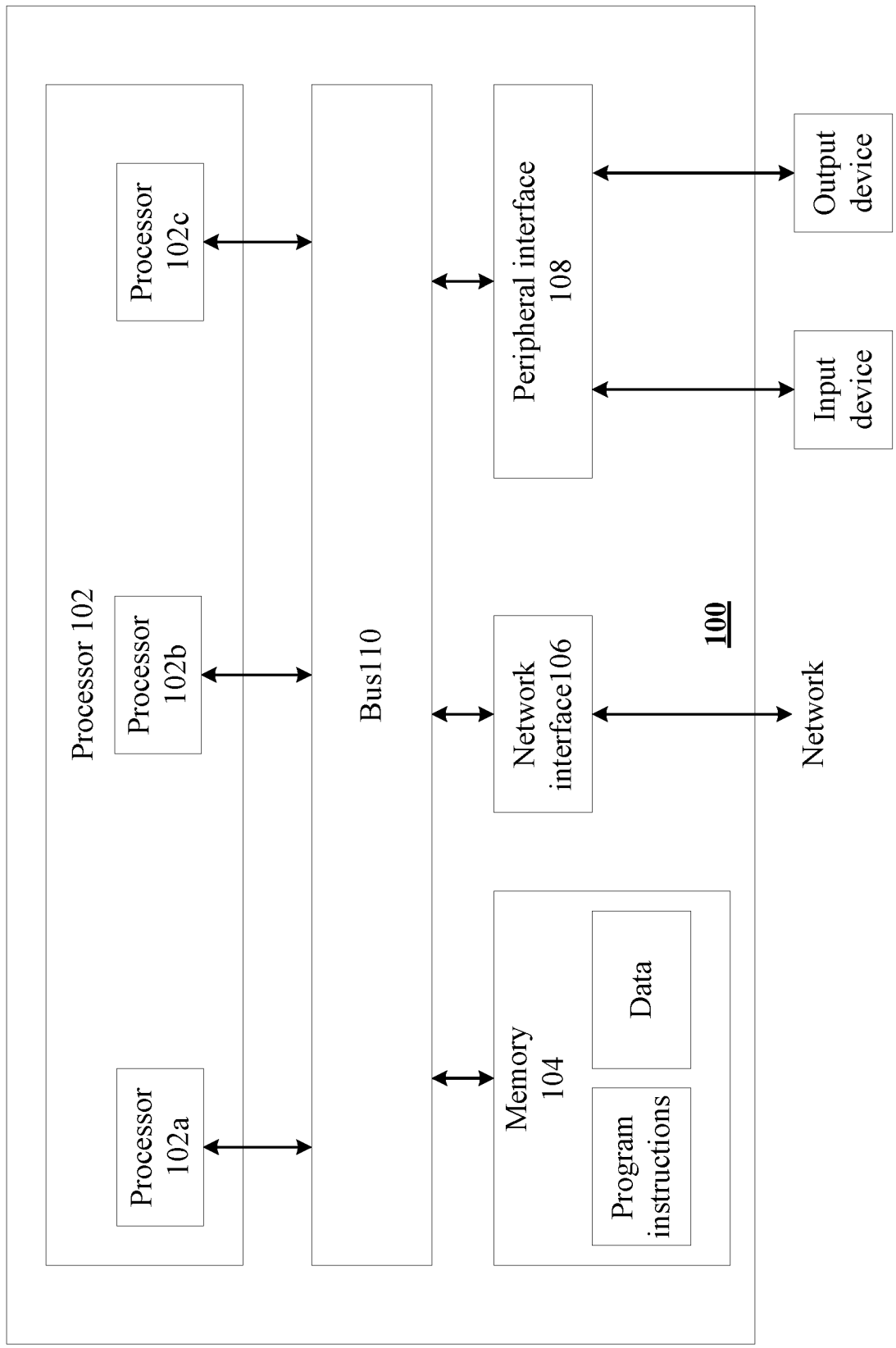
FIG. 1A illustrates a schematic structural diagram of an exemplary electronic device according to embodiments of the present disclosure.

FIG. 1A illustrates a schematic structural diagram of an exemplary electronic device 100 according to embodiments of the present disclosure. Electronic device 100 can be, for example, a host computer. Electronic device 100 can include: a processor 102, a memory 104, a network interface 106, a peripheral interface 108, and a bus 110. Processor 102, memory 104, network interface 106, and peripheral interface 108 can communicate with each other through bus 110 in the device.

Processor 102 can be a center processing unit (CPU), an image processor, a neural-network processing unit (NPU), a microcontroller unit (MCU), a programmable logical device, a digital signal processor (DSP), an application specific integrated circuit (ASIC), or one or more integrated circuits. Processor 102 can perform functions related to the technology described in the disclosure. In some embodiments, processor 102 can also include a plurality of processors integrated into a single logical component. As shown in FIG. 1A, processor 102 can include a plurality of processors 102a, 102b, and 102c.

Memory 104 can be configured to store data (e.g., an instruction set, computer codes, intermediate data). For example, as shown in FIG. 1A, the stored data can include program instructions (e.g., program instructions used to implement the technology of the disclosure) and the data to be processed (e.g., memory 104 can store temporary codes generated during compiling). Processor 102 can also access stored program instructions and data, and execute program instructions to operate the data to be processed. Memory 104 can include volatile storage devices or non-volatile storage devices. In some embodiments, memory 104 can include a random access memory (RAM), a read only memory (ROM), an optical disk, a magnetic disk, a hard disk, a solid state drive (SSD), a flash memory, a memory stick, and the like.

Network interface 106 can be configured to provide to electronic device 100 communication with other external devices via a network. The network can be any wired or wireless network capable of transmitting and receiving data. For example, the network can be a wired network, a local wireless network (e.g., a bluetooth, a WiFi, a near field communication (NFC), and the like), a cellular network, an internet, or a combination of the above. It is appreciated that, the type of the network is not limited to the above specific examples. In some embodiments, network interface 106 can include any number of network interface controllers (NICs), radio frequency modules, receivers, modems, routers, gateways, adapters, cellular network chips, or random combinations of the above.

Peripheral interface 108 can be configured to connect electronic device 100 with one or more peripheral devices to implement input and output of information. For example, the peripheral devices can include input devices, such as keyboards, microphones, touch panels, touch screens, microphones, various sensors, and output devices, such as displays, speakers, vibrators, and indicator lights.

Bus 110 can be configured to transmit information among various components (e.g., processor 102, memory 104, network interface 106, and peripheral interface 108) of electronic device 100, and can be, for example, an internal bus (e.g., a processor-storage bus), an external bus (a USB port, a PCI-E bus), and the like.

It should be noted that, although the foregoing devices merely illustrate processor 102, memory 104, network interface 106, peripheral interface 108, and bus 110, the devices in an actual implementation can also include other components needed for normal operations. In addition, it can be appreciated for those ordinary skilled in the art that the foregoing devices can also include the components necessary to implement the solutions of embodiments of the present disclosure and do not require to include all the components of figures.

Figure 1B:
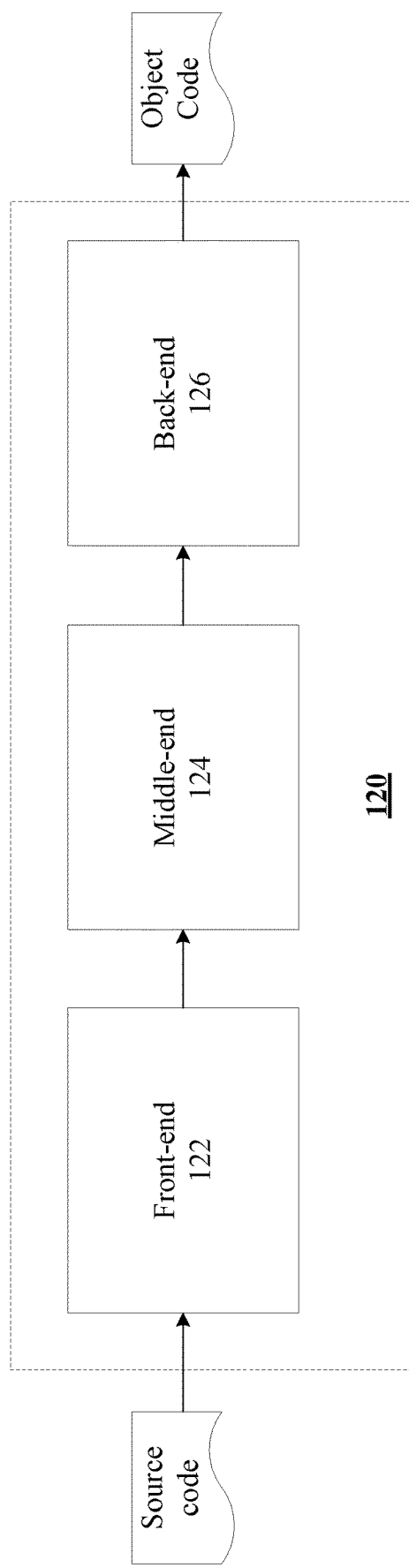
FIG. 1B illustrates a schematic diagram of an exemplary compiler.

FIG. 1B illustrates a schematic diagram of an exemplary compiler 120.

Compiler 120 can generate a computer program in object codes based on computer codes to be compiled. The computer codes to be compiled can also be referred as source codes. Generally, a source language for compiling the source codes can be a high-level programming language. The high-level programming language can be, for example, a software programming language, such as C++ and Java, or a hardware description language, such as VHDL, Verilog, and SystemVerilog. The object codes can be, for example, assembly codes, machine codes, and the like. In some embodiments of the present disclosure, the object codes are described by taking the machine codes as an example, but it can be appreciated for those ordinary skilled in the art that the machine codes in embodiments of the present disclosure can be replaced with other types of the object codes.

Compiler 120, for example, can be stored in memory 104 of FIG. 1A and be executed by processor 102.

As shown in FIG. 1B, compiler 120 can include a front-end 122, a middle-end 124, and a back-end 126.

Front-end 122 can be used to analyze lexing, grammar, and semantics of the source codes according to a specific source code language.

After completing the analysis of the lexing, grammar and semantics of the source codes, middle-end 124 can convert the source codes into intermediate representations (or intermediate codes), and can optimize the intermediate representations. For example, middle-end 124 can remove useless codes, remove inaccessible codes, clear unused variables, and the like. The optimization can include machine-related optimization and machine-independent optimization. The optimized intermediate representations can be transferred to back-end 126 for further processing.

Back-end 126 can further optimize the intermediate representations according to the architecture of a target processor (e.g., processor 102 of FIG. 1A), and generate object codes. Generally, the object codes are machine codes.

It is appreciated that, the structure of a compiler is not limited by examples of FIG. 1B. For example, front-end 122 and middle-end 124 can together be referred to as a front-end of the compiler.

Figure 2A:
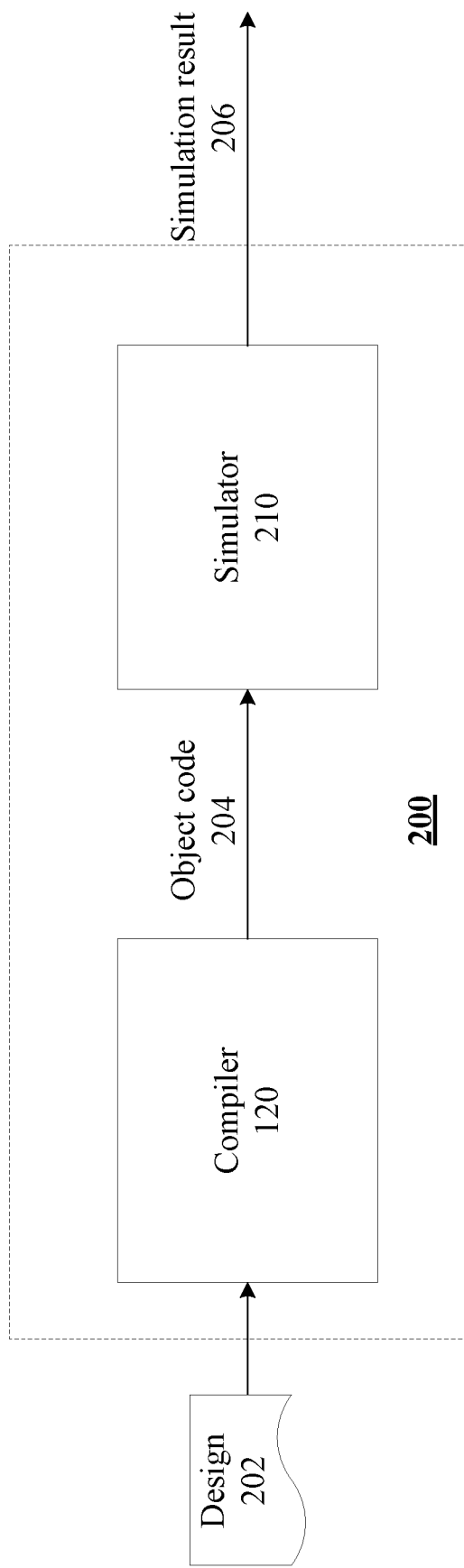
FIG. 2A illustrates a schematic diagram of an exemplary simulation tool.

FIG. 2A illustrates a schematic diagram of an exemplary simulation tool 200. simulation tool 200 can be a computer program running on electronic device 100.

In the area of chip design, generally simulation tool can be used to simulate a design. The simulation tool can be, for example, GalaxSim simulation tool provided by X-EPIC Cooperation Limited. Exemplary simulation tool 200 as shown in FIG. 2A can include compiler 120 and a simulator 210. Compiler 120 can compile a design 202 into an object code 204, and simulator 210 can simulate design 202 according to object code 204, so as to output a simulation result 206. For example, simulation tool 200 can output simulation results (e.g., a simulation waveform graph) to an output device (e.g., displayed on a display) via peripheral interface 108 of FIG. 1A.

In some embodiments, design 202 can be a verification environment, for example, a Universal Verification Methodology (UVM) environment, written in SystemVerilog language. By using simulation tool 200 to simulate design 202, a UVM environment can be established and a Device Under Test (DUT) can be verified in the UVM environment.

Figure 2B:
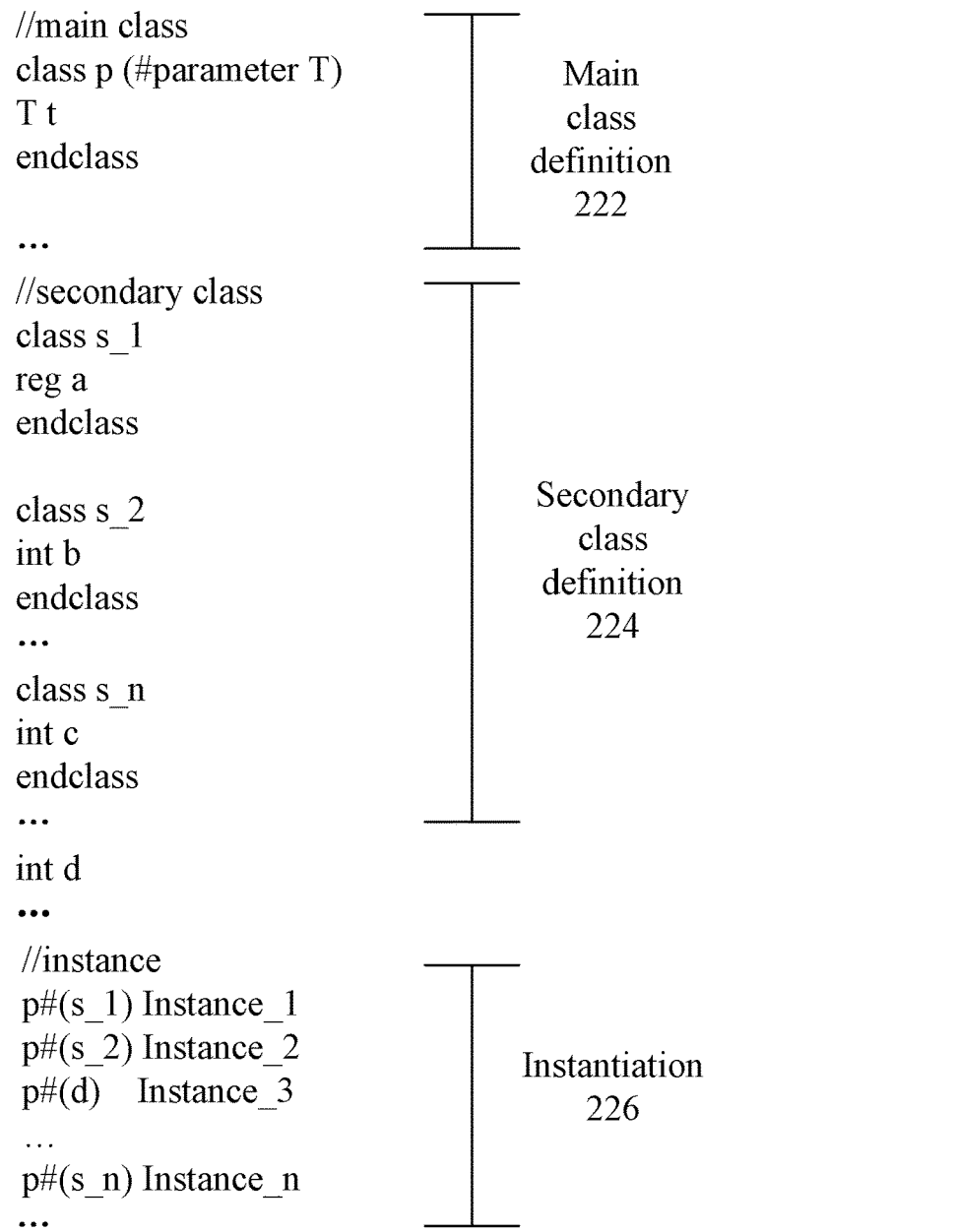
FIG. 2B illustrates an exemplary code segment used as a design of a UVM environment according to embodiments of the present disclosure.

In the UVM environment, a UVM register (uvm_reg) model is used to model the registers with addresses mapped in the DUT. FIG. 2B illustrates an exemplary code segment used as a design 220 of a UVM environment according to embodiments of the present disclosure. Design 220 can be written in SystemVerilog language. Design 220 is used to build the UVM environment to verify the DUT.

As shown in FIG. 2B, design 220 can include three parts of codes, namely, a main class definition 222, a secondary class definition 224, and an instantiation 226.

A main class "p" is a class having parameters. That is, while instantiating the main class "p", the object referenced by parameter "T" will also be instantiated. The parameter "T" can be another class or other data type (e.g., integer data). The another class referenced by the main class can be referred to as a secondary class.

The secondary class is defined in secondary class definition 224. In the example of FIG. 2B, the secondary classes include s_1, s_2, . . . , and s_n, and the secondary classes correspond to the model of the register with addresses mapped in the DUT. Because the DUT is generally a complete chip design project (e.g., a system-on-chip, an ASIC chip, and the like), the DUT has a huge number of registers. In some designs, the plurality of registers with addresses mapped can reach hundreds of thousands. That is, the number of secondary classes of design 220 can reach hundreds of thousands.

Therefore, while these secondary classes are instantiated with the main class "p", a huge number of the instantiations are needed. Generally, the compiler (e.g., vcs compiler, gpp compiler, and the like) needs to compile the plurality of instances (that is, s_1, s_2, . . . , and s_n), respectively. However, as described with reference to FIG. 1B, the compilation needs to go through a plurality of processes, which take a long time. Repeatedly compiling the huge number of instances can significantly reduce the efficiency of the compiler and ultimately degrade the performance of a simulation tool (e.g., simulation tool 200 of FIG. 2A).

The present disclosure provides a new compiler used to improve the efficiency of compilation.

Figure 3A:
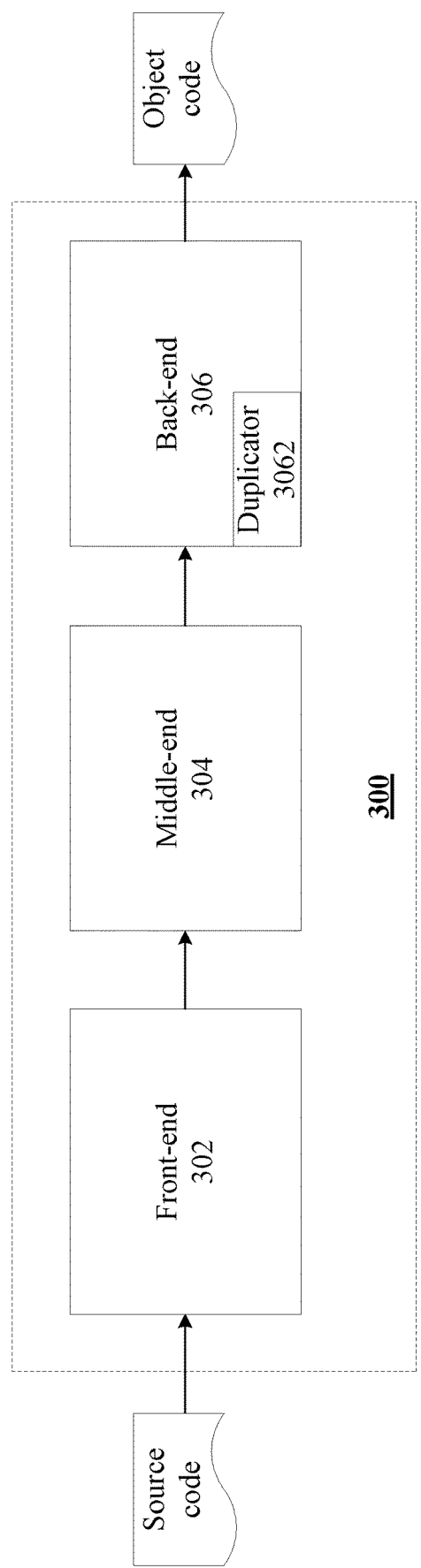
FIG. 3A illustrates a schematic diagram of an exemplary compiler according to embodiments of the present disclosure.

FIG. 3A illustrates a schematic diagram of an exemplary compiler according to embodiments of the present disclosure.

As shown in FIG. 3A, a compiler 300 can include a front-end 302, a middle-end 304 and a back-end 306. Back-end 306 further includes a duplicator 3062.

Front-end 302 can determine the plurality of secondary classes (e.g., s_1, s_2, . . . , s_n, and the like of FIG. 2B) involved in instantiating the main class (e.g., class P of FIG. 2B) by analyzing the design (e.g., design 220 of FIG. 2B).

Main class can be a class having parameters, and the parameters can be another secondary class or other data types (e.g., integer data). Therefore, in some embodiments, compiler 300 can first determine whether a parameter involved in an instance among a plurality of instances of the main class is a secondary class while analyzing the design. In some embodiments, compiler 300 can analyze the design by identifying parameters passed during instantiation. For example, with respect to an instance (e.g., Instance_1 of FIG. 2B) of the main class, compiler 300 can identify that the parameter (e.g., s_1 of FIG. 2B) passed during the instantiation is an integer rather than a class. Therefore, compiler 300 can determine whether a parameter involved in an instance among a plurality of instances of the main class is a secondary class. For cases where parameters (e.g., integer parameters) of an instance are non-secondary classes, compiler 300 can compile the instance (e.g., Instance_3 of FIG. 2B) to generate corresponding instance machine code.

For the convenience of description, we can assume that, among the plurality of secondary classes, there are a first secondary class (e.g., s_1 of FIG. 2B) corresponding to a first instance (e.g., Instance_1 of FIG. 2B) and a second secondary class (e.g., s_2 of FIG. 2B) corresponding to a second instance (e.g., Instance_2 of FIG. 2B)

It is appreciated that, although the first instance and other instances (e.g., the second instance) correspond to different secondary classes, the first instance and other instances are derived from instantiating the main class (e.g., main class of FIG. 2B), yet the difference between the first instance and other instances lies in the referenced secondary classes. Therefore, the machine code of the first instance is highly correlated with the machine code of other instances, and their difference also lies in the part of the code associated with the secondary class.

In view of this, embodiments of the present disclosure provide two types of new compilers to optimize compilation methods.

The first type of compiler uses a placeholder to generate a general instance and copies temporary codes generated based on the general instance to improve compilation speed. The second type of compiler uses the idea of hybrid compilation to improve compilation speed. The specific description is in the following.

In the first type of compiler, compiler 300 according to embodiments of the present disclosure can generate a general instance based on the first instance. In the general instance, a description of the first secondary class originally referenced by the first instance is replaced by the placeholder. The placeholder can be used to generate a secondary class address space pointing to one of the plurality of secondary classes. In some embodiments, the placeholder is a null pointer pointing to a secondary class, and accordingly, the secondary class address space is the address space of the pointer. The size of the address space of the pointer can depend on the type of operation system. For example, for a 32-bit operation system, the address space of the pointer is 32 bits; for a 64-bit operation system, the address space of the pointer is 64 bits.

For example, compiler 300 can generate a description of the general instance according to the description of the first instance (i.e., p#(s_1) Instance_1). For example, the description of the general instance can be described as below:

p#( ) Instance_G

Then, compiler 300 can generate a piece of temporary code by translating the above general instance. The translation refers to the conversion from one language to another language. In the temporary code, an address space that points to one of the plurality of secondary class machine codes is reserved. Because the temporary code is generated by replacing the secondary class referenced by the first instance with the placeholder, the temporary code is associated with the first instance, and is further associated with the second instance. It is appreciated that, the temporary code is still different from the instance machine code at this moment and cannot be executed directly. For example, the address space of the temporary code needs to be further compiled to obtain the secondary class machine code for actual operation.

In addition to generating the temporary code, compiler 300 can also compile the plurality of secondary classes to generate a plurality of secondary class machine codes corresponding to the plurality of secondary classes. For example, compiler 300 can compile the first secondary class and the second secondary class to respectively generate a first secondary class machine code and a second secondary class machine code. As discussed above, because the temporary code reserves the address space pointing to the secondary class machine code, the plurality of secondary class machine codes (e.g., the first secondary class machine code and the second secondary class machine code) can be called through the address space. The specific process will be further described in the following.

In summary, compiler 300 can translate design 220 to generate the temporary code associated with the plurality of instances, and compile the first secondary class and the second secondary class to generate corresponding secondary class machine codes, respectively. The temporary code can be stored in the memory for further processing.

Figure 4A:
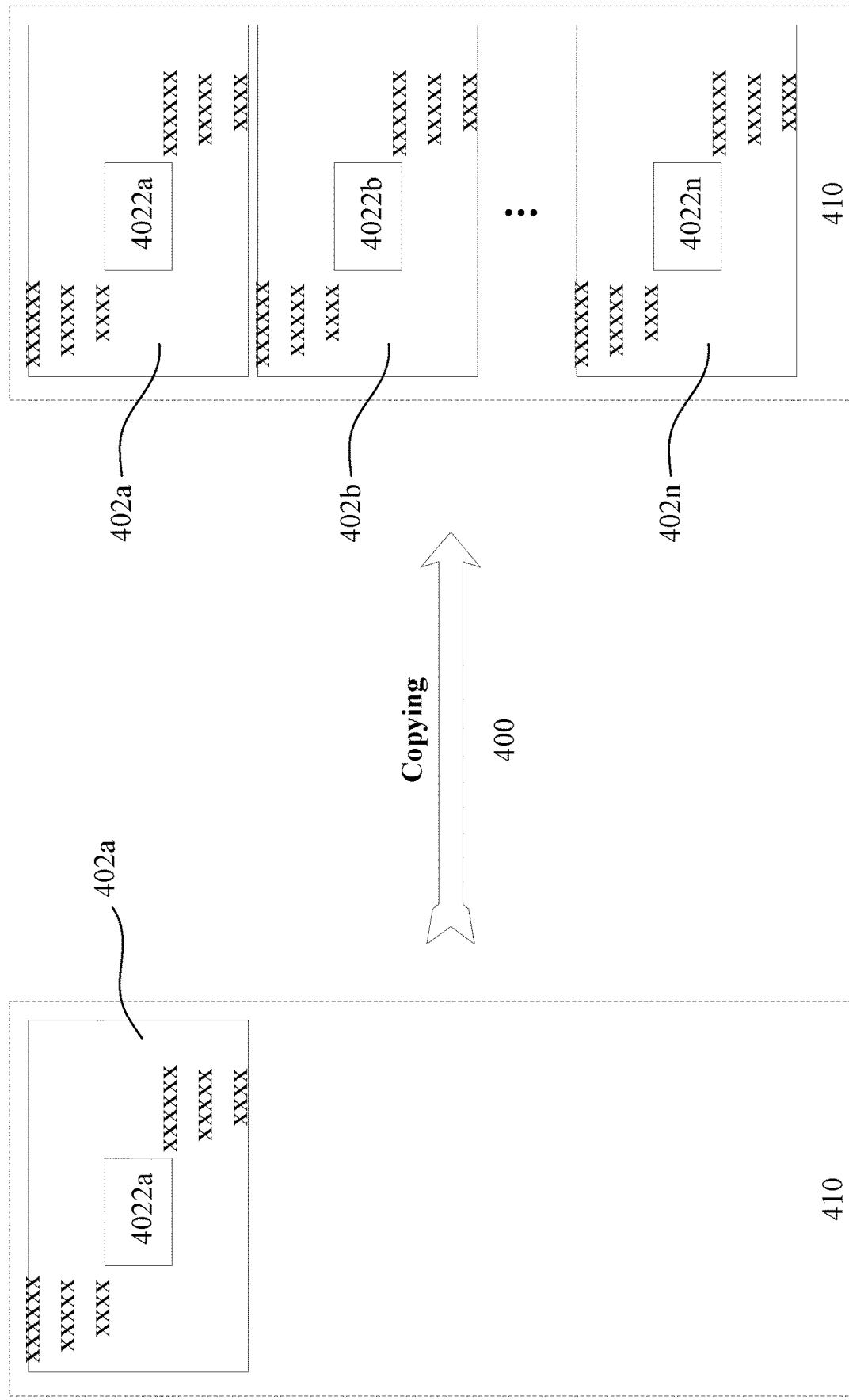
FIG. 4A illustrates a schematic diagram of the copying of temporary codes according to embodiments of the present disclosure.

Compiler 300 can further generate instance machine codes corresponding to the plurality of instances based on the above temporary code. FIG. 4A illustrates a schematic diagram of copying (400) of a temporary code according to embodiments of the present disclosure.

As shown in FIG. 4A, a temporary code 402a is stored in a memory area 410. Temporary code 402a includes the machine code generated by translating design 220 and the reserved address space 4022a.

Compiler 300 can copy temporary code 402a to generate temporary codes 402b-402n, and store temporary codes 402b-402n in memory area 410. Therefore, other than the different names for the codes, temporary codes 402b-402n are exactly the same.

It is appreciated that, for compiler 300, the computing power needed and the running time consumed for the copy operation are minimal.

Figure 4B:
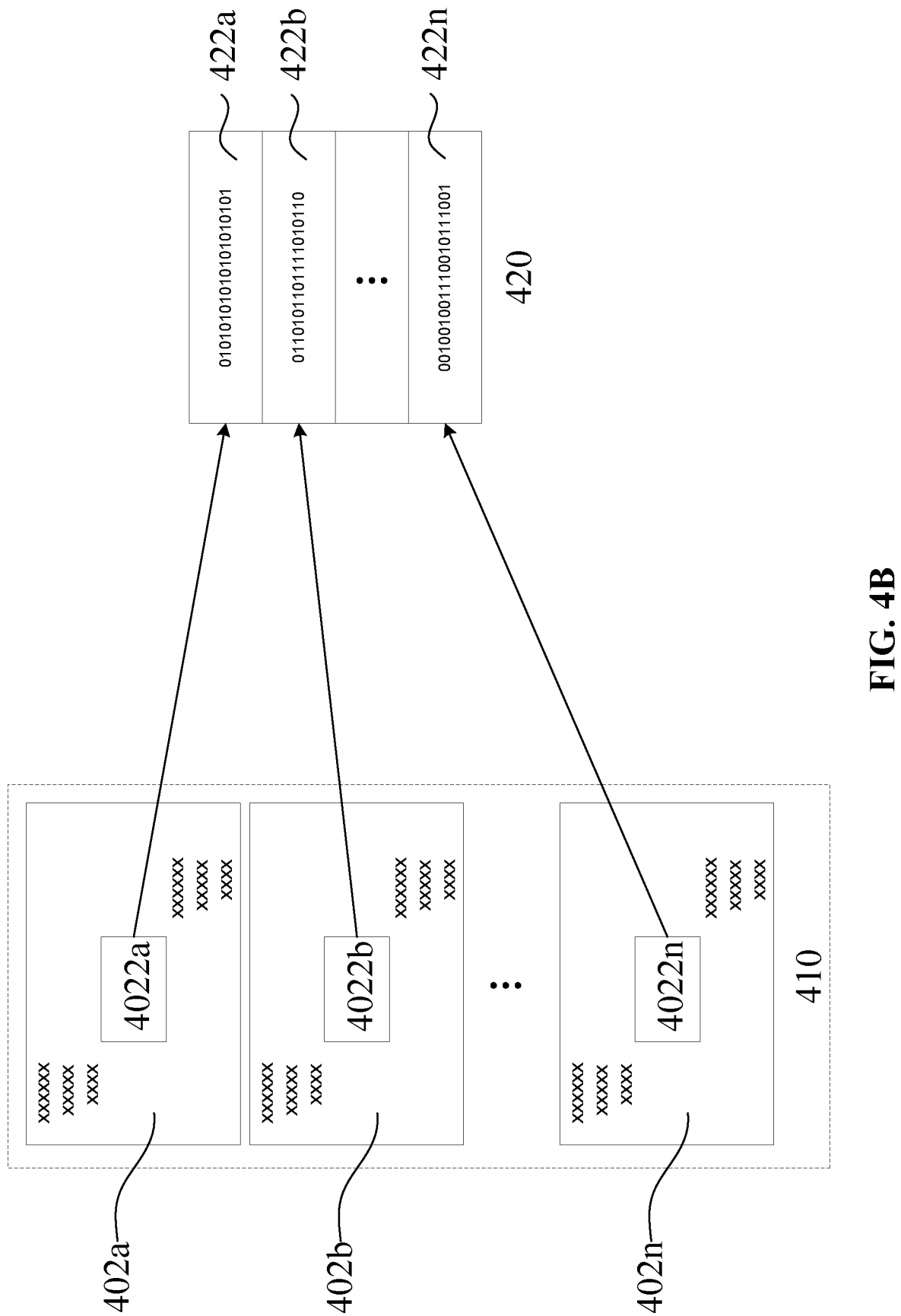
FIG. 4B illustrates a schematic diagram of an address link of temporary codes according to embodiments of the present disclosure.

After the copy operation is completed, compiler 300 can further perform an address linking operation. FIG. 4B illustrates a schematic diagram of an address linking of a temporary code according to embodiments of the present disclosure.

As shown in FIG. 4B, a plurality of secondary class machine codes 422a-422n are stored in the corresponding addresses in a memory area 420. Compiler 300 can point secondary class address space 4022a of temporary code 402a to secondary class machine code 422a, and point secondary class address space 4022b of temporary code 402b to secondary class machine code 422b, and similarly point secondary class address space 4022n of temporary code 402n to secondary class machine code 422n. In other words, compiler 300 can patch the address of a secondary class machine code into the blank address space in the temporary code.

In this way, by linking the address space of the temporary code to a secondary class machine code, the secondary class machine code is patched into the temporary code through address linking, and the secondary class machine code, together with other machine codes can make a complete instance machine code.

Figure 3B:
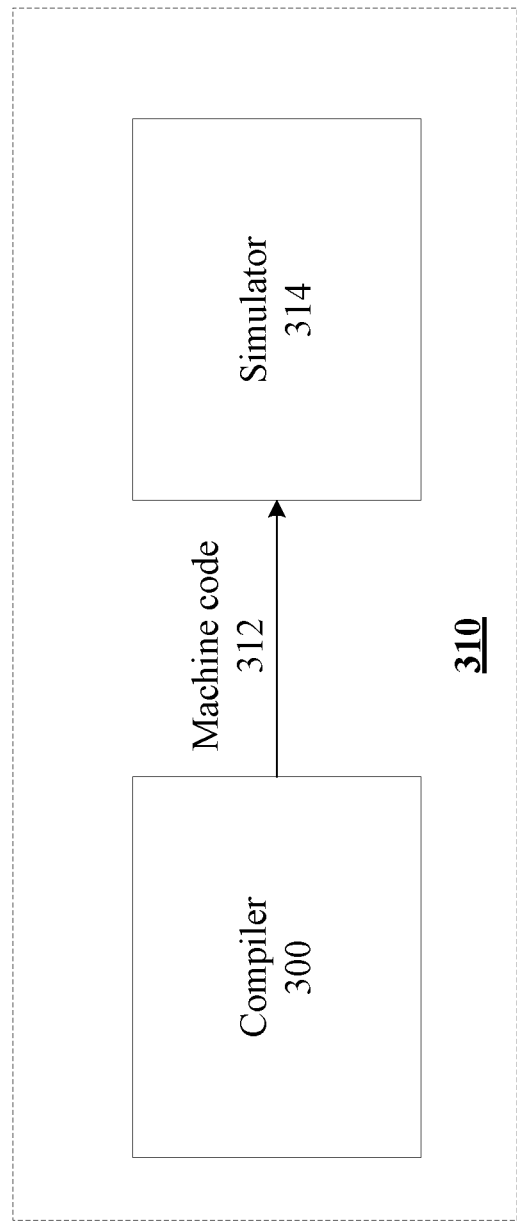
FIG. 3B illustrates a schematic diagram of an exemplary simulation tool according to embodiments of the present disclosure.

FIG. 3B illustrates a schematic diagram of an exemplary simulation tool 310 according to embodiments of the present disclosure. As shown in FIG. 3B, compiler 300 can generate a plurality of instance machine codes, and a simulator 314 of simulation tool 310 can simulate the design based on a machine code 312 included in the plurality of instance machine codes.

The first type of compiler described above uses the placeholder to generate the general instance and copies the temporary codes to improve compilation speed. Because the computing power and time consumption for copying a temporary code is much less than compiling an instance, the method can improve compilation speed, and generate same machine codes as conventional compilation methods, so that the running speed of the machine codes can be maintained.

In the second type of compiler, the code associated with calling the instance of the secondary class in design 220 is processed in a hybrid compilation method by an interpreter, and other codes are processed by a conventional compiler (e.g., compiler 120 of FIG. 1B).

A conventional interpreted language compiler only translates source codes into intermediate codes during compilation, and interpret the intermediate codes by interpreters during the runtime. In this way, the portability of codes can be improved. However, because the source codes need to be interpreted every time it is executed, the runtime performance of the interpreted language is usually low. By learning from the execution method of interpreted languages and mixing interpreters and compilers, not only the portability of calling instances of secondary classes can be improved, but also the efficiency of code execution can be ensured to a certain extent.

Figure 5A:
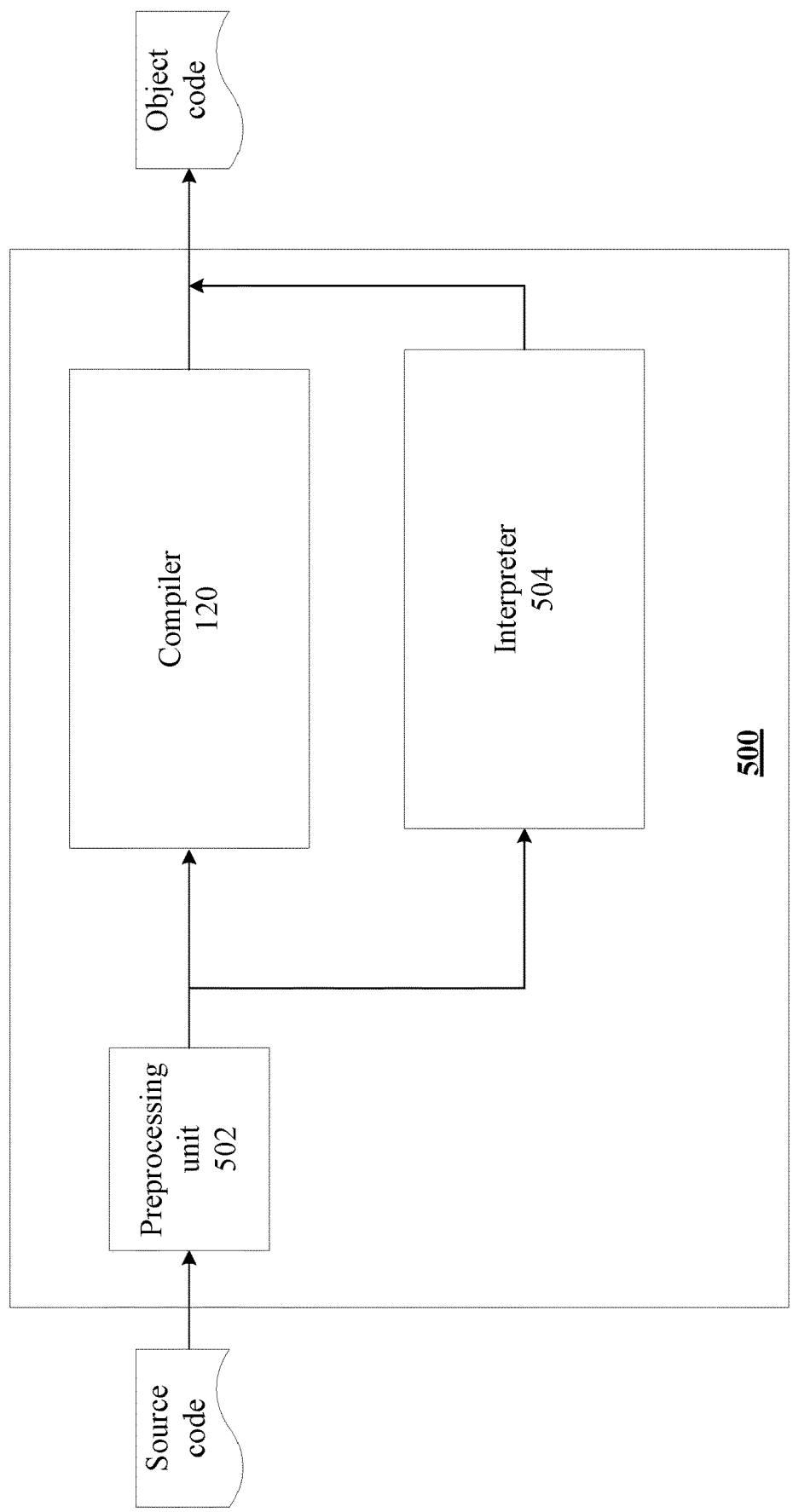
FIG. 5A illustrates another schematic diagram of an exemplary compiler according to embodiments of the present disclosure.

FIG. 5A illustrates another schematic diagram of an exemplary compiler 500 according to embodiments of the present disclosure.

As shown in FIG. 5A, compiler 500 can include a preprocessing unit 502, compiler 120 of FIG. 1B, and an interpreter 504. The description of compiler 120 will not be repeated.

In some embodiments, preprocessing unit 502 is used to preprocess the source code of design 220 while translating design 220, so that it can assign the code associated with calling the instances of the secondary class to interpreter 504, and assign other codes to compiler 120. Compiler 120 can compile the other codes to corresponding machine codes, and based on the code associated with calling the instances of the secondary class, interpreter 504 can generate intermediate codes corresponding to the plurality of instances.

Compiler 500 can combine the machine codes with the intermediate codes to generate temporary codes.

While executing the temporary codes, compiler 500 can determine a target instance for generating machine codes, and call interpreter 504 to interpret the corresponding intermediate codes for the target instance, and generate the target instance machine code based on the intermediate code. In this way, compiler 500 can achieve a balance between compilation speed and execution speed through hybrid compilation.

Figure 5B:
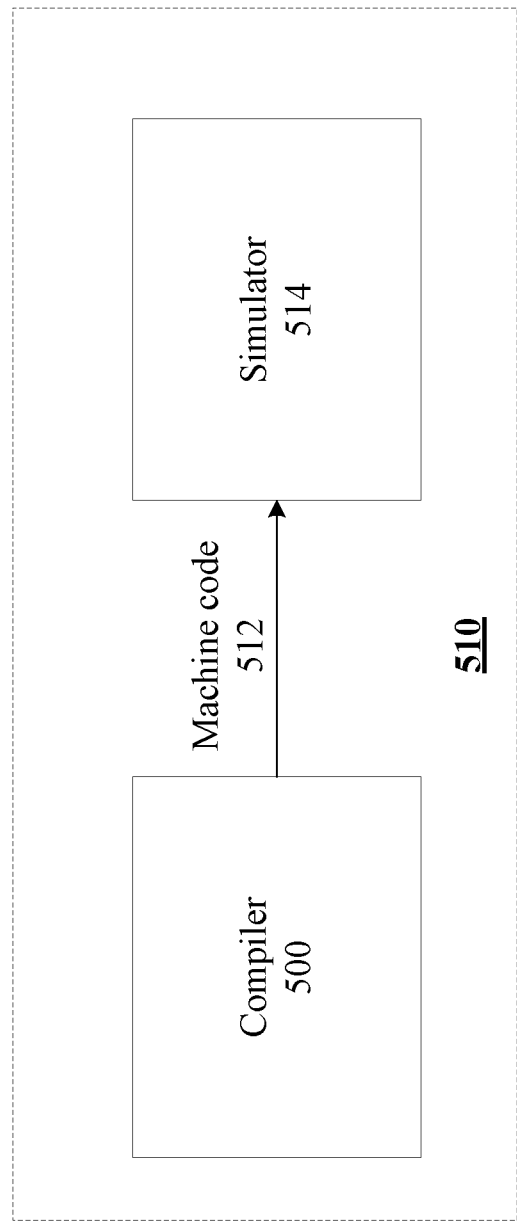
FIG. 5B illustrates another schematic diagram of an exemplary simulation tool according to embodiments of the present disclosure.

FIG. 5B illustrates another schematic diagram of an exemplary simulation tool 510 according to embodiments of the present disclosure. As shown in FIG. 5B, compiler 500 can generate a plurality of instance machine codes, and a simulator 514 in simulation tool 510 can simulate the design based on machine codes 512 which includes the plurality of instance machine codes.

The embodiments of the present disclosure also provide a method for simulating the design.

Figure 6:
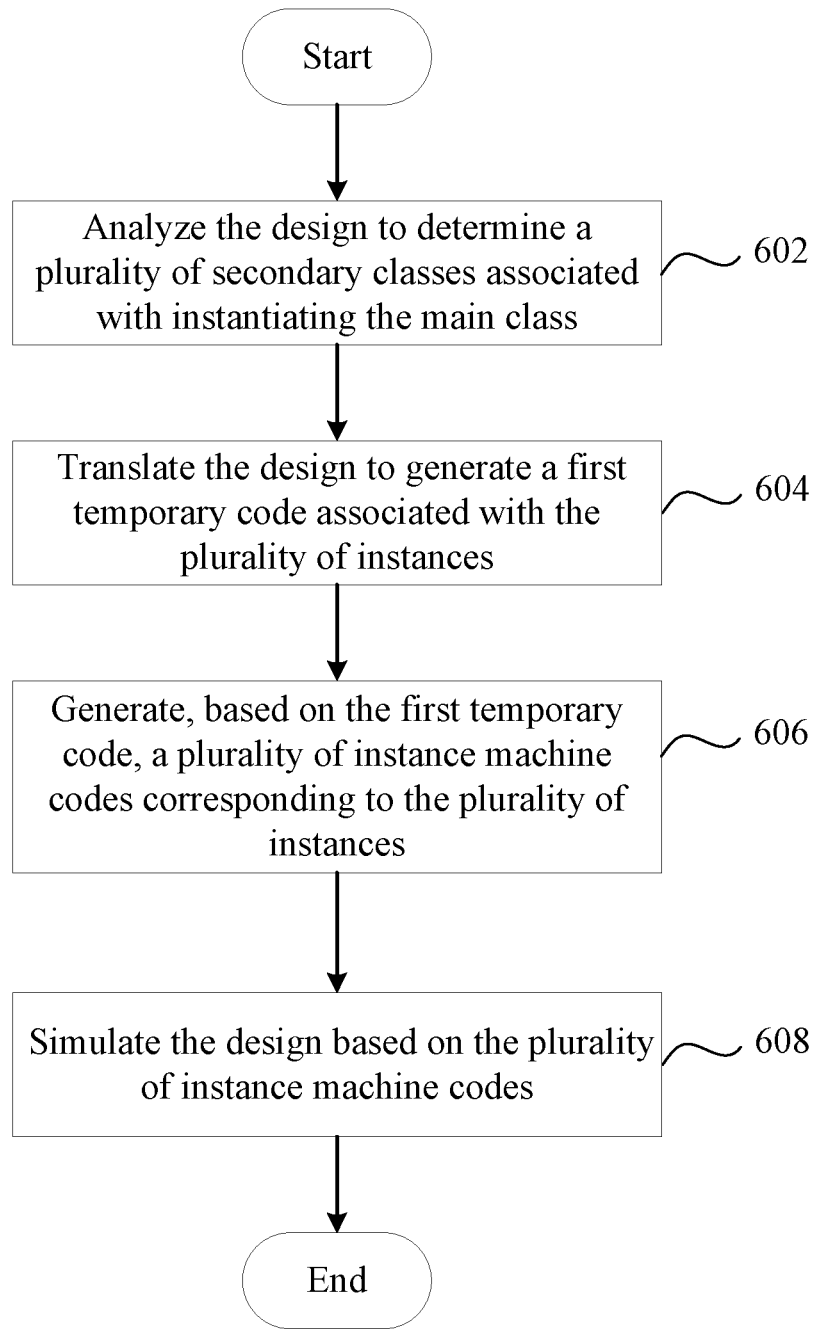
FIG. 6 is a flowchart of an exemplary method for simulating a design according to embodiments of the present disclosure.

FIG. 6 is a schematic flowchart of an exemplary method 600 for simulating a design according to embodiments of the present disclosure. The design can be design 220 of FIG. 2B. Design 220 is used to build a universal verification methodology environment to verify a device under test (DUT). Design 220 can include a main class (e.g., class P of FIG. 2B) with parameters (e.g., parameter T of FIG. 2B) and a plurality of instances (e.g., a first instance Instance_1, a second instance Instance_2, and a third instance Instance_3). In some embodiments, method 600 can be implemented by electronic device 100 of FIG. 1A. For example, method 600 can be implemented by simulation tool 310 of FIG. 3B or simulation tool 510 of FIG. 5B. Method 600 can include the following steps.

At step 602, the simulation tool can analyze the design to determine a plurality of secondary classes (e.g., s_1, s_2, s_3, and the like) associated with instantiating the main class. The plurality of secondary classes are used as the parameters of the main class, and include a first secondary class corresponding to the first instance and a second secondary class corresponding to the second instance. As discussed above, the plurality of secondary classes correspond to a plurality of registers in the device under test. Therefore, a number of secondary classes can reach hundreds of thousands.

In some embodiments, because a parameter is not necessarily a secondary class, analyzing the design can further include: determining whether a parameter associated with an instance of the plurality of instances of the main class is a secondary class. For example, the parameter associated with the third instance is not a secondary class, therefore the simulation tool can compile the third instance to generate a third instance machine code.

At step 604, the simulation tool can translate the design to generate a first temporary code (e.g., temporary code 402a of FIG. 4A) associated with the plurality of instances. In some embodiments, translating the design can further include: generating a plurality of secondary class machine codes (e.g., secondary class machine codes 422a~422n of FIG. 4B) corresponding to the plurality of secondary classes, wherein the first temporary code includes secondary class address space (e.g., address space 4022a of FIG. 4A) pointing to one of the plurality of secondary classes; generating a general instance based on the first instance, wherein the general instance includes a placeholder for replacing the first secondary class and the placeholder is used to generate the secondary class address space; and translating the general instance to generate the first temporary code.

At step 606, based on the first temporary code, the simulation tool can generate a plurality of instance machine codes corresponding to the plurality of instances. For example, the plurality of instance machine codes can include a first secondary class machine code corresponding to the first secondary class and a second secondary class machine code corresponding to the second secondary class. In some embodiments, generating a plurality of instance machine codes corresponding to the plurality of instances can further include: copying the first temporary code to generate a second temporary code (e.g., 402b of FIG. 4B); pointing the secondary class address space of the first temporary code to the first secondary class machine code and pointing the secondary class address space of the second temporary code to the second secondary class machine code; patching the first secondary machine code and the second secondary machine code respectively into the first temporary code and the second temporary code to generate a first instance machine code and a second instance machine code.

In some embodiments, when the simulation tool is simulation tool 510 of FIG. 5B, the first temporary code can include intermediate codes corresponding to the plurality of instances, and generating a plurality of instance machine codes corresponding to the plurality of instances based on the first temporary code can further include: determining a target instance for generating machine codes; calling an interpreter for interpreting the intermediate codes for the target instance; and generating target instance machine codes based on the intermediate codes.

At step 608, based on the plurality of instance machine codes, the simulation tool can simulate the design.

It should be noted that, the method of the present disclosure can be executed by a single device, for example, a computer, a server, and the like. The method of the embodiments can also be applied in a distributed scenario, and be implemented by a plurality of devices which can cooperate with each other. In the distributed scenario, one of the plurality of devices can only perform one or more steps in the method of the present disclosure, and the plurality of devices will interact with each other to implement the method.

The computer-readable medium in the present disclosure includes permanent and non-permanent, removable, and non-removable media, and information storage can be realized by any method or technology. The information can be computer readable instructions, data structures, program modules or other data. The storage medium, for example, include, but are not limited to, phase change memory (PRAM), static random access memory (SRAM), dynamic random access memory (DRAM), other types of random access memory (RAM), read-only memory (ROM), electrically erasable programmable read-only memory (EEPROM), flash memory or other memory technology, CD-ROM, digital versatile disc (DVD) or other optical storage, Magnetic cassettes, magnetic tape magnetic disk storage or other magnetic storage devices or any other non-transmission media can be used to store information that can be accessed by computing devices.

The specific embodiments of the present disclosure are described above. Other embodiments are within the scope of the claims. In some circumstances, the actions or steps in the claims can execute in a different order from the embodiments and still achieve the desired result. In addition, the process depicted in the drawings does not require the specific order or sequential order in order to achieve the desired results. In some embodiments, multitasking and parallel processing are also possible or can be advantageous.

It can be appreciated for those ordinary skilled in the art: any embodiments discussed above are merely exemplary and do not indicate that the scope of the present disclosure is limited by these embodiments; under the idea of the present disclosure, embodiments or the technical features in different embodiments above can make a combination, the steps can be implemented in any order, and can have different changes in different aspects of the present disclosure as described above, and for brevity, there are not provided in details.

In addition, to simplify the description and discussion, the well-known power source/ground connected to integrated circuit (IC) chips and other components may or may not be shown in the provided drawings. In addition, the devices can be shown in the form of diagrams to avoid making the present disclosure difficult to understand, and this also takes the following facts that the details (that is, the details are understood by those ordinary skilled in the art) of the implementation of these devices in diagrams are highly dependent on the platform which will implement the present disclosure into consideration. Under the circumstance that details (for example, circuits) are described to describe exemplary embodiments of the present disclosure, it is obvious to those skilled in the art that it can be possible to implement the present disclosure without these specific details or upon changing of these specific details.

Although the present disclosure has been described in conjunction with specific embodiments of the present disclosure, the plurality of substitutions, modifications, and variations of these embodiments can be obvious to those skilled in the art according to the foregoing description. For example, other memory architectures (e.g., dynamic RAM (DRAM)) can be used in the discussed embodiments.

The present disclosure is intended to cover all such substitutions, modifications and variations that fall within the broad scope of the appended claims. Therefore, any omission, modification, equivalent replacement, improvement, and the like within the spirit and principle of the present disclosure should be included in the protection scope of the present disclosure.

What is claimed is:

1. A method for simulating a design, wherein the design comprises a main class with parameters and a plurality of instances of the main class, wherein the plurality of instances comprise a first instance and a second instance, the method comprising:
   determining, by analyzing the design, a plurality of secondary classes associated with instantiating the main class, wherein the plurality of secondary classes are used as the parameters of the main class and comprise a first secondary class corresponding to the first instance and a second secondary class corresponding to the second instance;
   translating the design to generate a first temporary code associated with the plurality of instances;
   generating, based on the first temporary code, a plurality of instance machine codes corresponding to the plurality of instances; and
   simulating the design based on the plurality of instance machine codes.

2. The method of claim 1, wherein translating the design further comprises:
   generating a plurality of secondary class machine codes corresponding to the plurality of secondary classes, wherein the first temporary code comprises a secondary class address space for pointing to one of the plurality of secondary class machine codes;
   generating a general instance based on the first instance, wherein the general instance comprises a placeholder for replacing the first secondary class, and the placeholder is used to generate the secondary class address space; and
   translating the general instance to generate the first temporary code.

3. The method of claim 2, wherein the plurality of secondary class machine codes comprise a first secondary class machine code corresponding to the first secondary class and a second secondary class machine code corresponding to the second secondary class, and generating, based on the first temporary code, the plurality of instance machine codes corresponding to the plurality of instances further comprises:
   copying the first temporary code to generate a second temporary code;
   pointing the secondary class address space of the first temporary code to the first secondary class machine code and pointing a secondary class address space of the second temporary code to the second secondary class machine code; and
   patching the first secondary class machine code and the second secondary class machine code respectively into the first temporary code and the second temporary code to generate a first instance machine code and a second instance machine code.

4. The method of claim 1, wherein the design is used to build a Universal Verification Methodology environment to verify a Device under test.

5. The method of claim 4, wherein the plurality of secondary classes correspond to a plurality of registers of the Device under test.

6. The method of claim 1, wherein analyzing the design further comprises:
   determining whether a parameter associated with an instance of the plurality of instances of the main class is a secondary class.

7. The method of claim 6, wherein the plurality of instances comprise a third instance, and in response to determining a parameter associated with the third instance being not a secondary class, the method further comprises:
   compiling the third instance to generate an instance machine code.

8. The method of claim 1, wherein the first temporary code comprises intermediate codes corresponding to the plurality of instances, and generating, based on the first temporary code, a plurality of instance machine codes corresponding to the plurality of instances further comprises:
   determining a target instance for generating a machine code;
   calling an interpreter to interpret the intermediate code for the target instance; and
   based on the intermediate code, generating a target instance machine code.

9. An electronic device, comprising:
   a memory storing a set of instructions; and
   at least one processor, configured to execute the set of instructions to perform a method for simulating a design, wherein the design comprises a main class with parameters and a plurality of instances of the main class, wherein the plurality of instances comprise a first instance and a second instance, the method comprising:
   determining, by analyzing the design, a plurality of secondary classes associated with instantiating the main class, wherein the plurality of secondary classes are used as the parameters in the main class and comprise a first secondary class corresponding to the first instance and a second secondary class corresponding to the second instance;
   translating the design to generate a first temporary code associated with the plurality of instances;
   generating, based on the first temporary code, a plurality of instance machine codes corresponding to the plurality of instances; and
   simulating the design based on the plurality of instance machine codes.

10. The electronic device of claim 9, wherein in translating the design, the electronic device is further configured to perform:
    generating a plurality of secondary class machine codes corresponding to the plurality of secondary classes, wherein the first temporary code comprises a secondary class address space for pointing to one of the plurality of secondary class machine codes;
    generating a general instance based on the first instance, wherein the general instance comprises a placeholder for replacing the first secondary class, and the placeholder is used to generate the secondary class address space; and
    translating the general instance to generate the first temporary code.

11. The electronic device of claim 10, wherein the plurality of secondary class machine codes comprise a first secondary class machine code corresponding to the first secondary class and a second secondary class machine code corresponding to the second secondary class, and in generating, based on the first temporary code, the plurality of instance machine codes corresponding to the plurality of instances, the electronic device is further configured to perform:
- copying the first temporary code to generate a second temporary code;
- pointing the secondary class address space of the first temporary code to the first secondary class machine code and pointing a secondary class address space of the second temporary code to the second secondary class machine code; and
- patching the first secondary class machine code and the second secondary class machine code respectively into the first temporary code and the second temporary code to generate a first instance machine code and a second instance machine code.

12. The electronic device of claim 9, wherein the design is used to build a Universal Verification Methodology environment to verify a Device under test.

13. The electronic device of claim 12, wherein the plurality of secondary classes correspond to a plurality of registers of the Device under test.

14. The electronic device of claim 9, wherein in analyzing the design, the electronic device is further configured to perform:
- determining whether a parameter associated with an instance of the plurality of instances of the main class is a secondary class.

15. The electronic device of claim 14, wherein the plurality of instances comprise a third instance, and in response to determining a parameter associated with the third instance be not a secondary class, the electronic device is further configured to perform:
- compiling the third instance to generate an instance machine code.

16. The electronic device of claim 9, wherein the first temporary code comprises intermediate codes corresponding to the plurality of instances, and in generating, based on the first temporary code, a plurality of instance machine codes corresponding to the plurality of instances, the electronic device is further configured to perform:
- determining a target instance for generating a machine code;
- calling an interpreter to interpret the intermediate code for the target instance; and
- based on the intermediate code, generating a target instance machine code.

17. A non-transitory computer-readable storage medium that stores a set of instructions that is executable by at least one processor of a computer system to cause the computer system to perform a method for simulating a design, wherein the design comprises a main class with parameters and a plurality of instances of the main class, wherein the plurality of instances comprise a first instance and a second instance, the method comprising:
- determining, by analyzing the design, a plurality of secondary classes associated with instantiating the main class, wherein the plurality of secondary classes are used as the parameters in the main class and comprise a first secondary class corresponding to the first instance and a second secondary class corresponding to the second instance;
- translating the design to generate a first temporary code associated with the plurality of instances;
- generating, based on the first temporary code, a plurality of instance machine codes corresponding to the plurality of instances; and
- simulating the design based on the plurality of instance machine codes.

* * * * *